(12) United States Patent  
Oppermann

(10) Patent No.: US 7,861,914 B2
(45) Date of Patent: Jan. 4, 2011

(54) SELF-ASSEMBLY OF COMPONENTS

(75) Inventor: Hans-Hermann Oppermann, Berlin (DE)

(73) Assignee: Fraunhofer-Gesellschaft Zur Foerderung Der Angewandten Forschung E.V., Munich (DE)

(*) Notice: Subject to any disclaimer, the term of this patent is extended or adjusted under 35 U.S.C. 154(b) by 0 days.

(21) Appl. No.: 12/574,753

(22) Filed: Oct. 7, 2009

(65) Prior Publication Data

US 2010/0096439 A1 Apr. 22, 2010

(30) Foreign Application Priority Data

Oct. 16, 2008 (DE) ............ 10 2008 051 917
Feb. 5, 2009 (DE) ............ 10 2009 008 032

(51) Int. Cl.
*B23K 1/00* (2006.01)
*B23K 1/19* (2006.01)
*B23K 20/00* (2006.01)

(52) U.S. Cl. ............ 228/234.1; 228/123.1; 228/179.1; 228/178

(58) Field of Classification Search ............ 228/123.1, 228/179.1, 178, 234.1
See application file for complete search history.

(56) References Cited

U.S. PATENT DOCUMENTS

| 2002/0005294 A1 | 1/2002 | Mayer et al. |
| 2006/0223205 A1 | 10/2006 | Jacobs et al. |
| 2007/0007237 A1* | 1/2007 | Wu et al. ............ 216/2 |

FOREIGN PATENT DOCUMENTS

EP 0981159 A1 2/2000

OTHER PUBLICATIONS

Mei Liu, W.M.Lau; Jun Yang; On-Demand Multi-Batch Self-Assembly of Hybrid MEMS by Patterning Solders of Different Melting Points; Journal of Micromechanics and Microengineering; ISSN 0960-1317, vol. 17, pp. 2163-2168, Sep. 27, 2007.

* cited by examiner

*Primary Examiner*—Jessica L Ward
*Assistant Examiner*—Erin B Saad
(74) *Attorney, Agent, or Firm*—Marshall & Melhorn, LLC

(57) ABSTRACT

A method is provided for the production of a bond between a first element having at least one first metal coating and at least one further element having a second metal coating, the at least one further element being freely moveable in a medium and the at least one first metal coating of the first element and the second metal coating of the at least one further element being in a solid state, a liquid phase being formed upon contact of the at least one first metal coating with the second metal coating.

15 Claims, 3 Drawing Sheets

SELF-ASSEMBLY OF COMPONENTS

BACKGROUND OF THE INVENTION

The invention relates to a method for the production of bonds between a substrate and a plurality of components by self-assembly.

The assembly of in particular small components can be associated with comparatively high complexity due to corresponding handling techniques which comprise picking up the component, positioning it, setting it down and contacting it.

The self-assembly of components is therefore a principle which represents a solution. The component to be assembled must be guided to a specific position, adjusted and permanently fixed for this purpose.

At present, for the self-assembly of components there are used a heated medium, components moved in this medium and solder contacts applied on a substrate. The medium is heated to such an extent that the solder contacts are liquid and the bond metallisations of the components are wetted during contact. After a sufficient number of components have occupied the substrate places, the temperature of the medium is reduced and the solder solidifies. Only then are the components permanently bonded to the substrate. The solder contacts on the substrate can hereby be liquid over a fairly long period of time, which has the disadvantage that metallisation layers situated below the solder contact dissolve completely and the solder is dewetted or the melting point of the solder is displaced by the metal brought in solution to such an extent that the solder solidifies before the bond metallisation of a component can be wetted.

SUMMARY OF THE INVENTION

The object is to develop a method with which premature dewetting by dissolution of the metallisation under the solder is prevented and with which excessive dissolution is avoided, which leads to premature solidification before a component can be bonded to the metallisation by wetting of the still liquid solder contact.

This object is achieved according to the invention by a method in which the solder is only formed on the substrate itself with a desired arrangement of components, thereupon melts, solidifies again without a temperature drop and a reliable bond between substrate and components is produced, as described in the features of claim 1. Advantageous embodiments and developments of the invention are revealed in the features of the sub-claims.

A method for the production of a bond between a first element having at least one first metal coating and at least one further element having a second metal coating is proposed, the at least one further element being freely moveable in a medium and the at least one first metal coating of the first element and the second metal coating of the at least one further element being in a solid state, a liquid phase being formed upon contact of the at least one first metal coating with the second metal coating. As a result of convection in the liquid solder, the solder reacts very much more rapidly with metallisations situated thereunder and can degrade due to the production of intermetallic phases or dewetting of the solder. In contrast, a solid solder contact degrades only as a result of diffusion processes which take place significantly more slowly. Since the metal coatings are solid, there are no unintentional interactions or bonds between similar metal layers even during mutual contact. Only when a first metal coating and a second metal coating are in contact with each other does a melting process occur and the first and the second element are bonded to each other. After the melting of a solder formed from the metal layers, surfaces wetted therewith are disposed in such a manner that the at least one element is adjusted by the surface tension of the solder on the substrate itself. No reduction in temperature of the liquid medium is required in order to solidify the bond since, by further dissolving-in of metal from the coatings, the formed solder is displaced in concentration until solidification.

The first element can be designed as substrate and can be configured for the production of a bond with at least one further element which is designed for example as a component. Hence, a further field of use for the production of a mechanical and electrical bond of different elements on one substrate is possible.

The at least one component can be designed as a functional layer, the functional layer being able to be produced from a semiconducting, a ferroelectric, a dielectric, a polarising or a piezoelectric material. The functional layer can be present in the form of a board comprising a large number of materials for which the method according to the invention can be used.

The liquid medium can be formed from glycerine, ketones, sugar or higher alcohols and be present in a defined temperature range between 278° C. and 309° C. Several media are suitable for use as liquid medium for the method according to the invention as long as they are present as a liquid in the mentioned temperature range, form no compounds with the metal coatings and have a sufficiently high specific heat capacity.

A plurality of first metal coatings can be disposed adjacently on the first element. Hence the first element which is designed for example as substrate is able to be connected to a plurality of second elements.

The first element and the at least one further element can have a complementary, geometric shape and a mechanical limit stop. As a result, a preorientation of the elements to be connected can be effected in addition in that mechanical structures permit only specific orientations in order that, for example, the correct polarity of a component is ensured.

The first metal coating can be composed predominantly of gold and tin in a defined atomic ratio which is in a range of 50:50 to 34:66. In order to avoid melting below a temperature of 309° C., the maximum tin proportion should not exceed a value of 66.7%.

The second metal coating can be formed exclusively from gold or be composed predominantly of gold and tin in a defined atomic ratio which is in a range of 100:0 to 84:16. For the mentioned range, the melting temperature is significantly more than 400° C.

The first metal coating and the second metal coating can be present in layers or even as an alloy and, upon contact, form the solder within the medium which is maintained in a temperature range of 278° C. to 309° C. since the eutectic of the gold-tin alloy is at 30 atomic percentage tin, when the melting temperature is 278° C. The concentration also moves in this direction to a low-melting composition if a first metal coating comes into contact with a second metal coating.

As components for a low-melting solder which is formed from higher-melting layers, the metal layers can be replaced partially or entirely by other suitable materials. Included thereby are all materials which are suitable for diffusion soldering and fall within the term "Transient Liquid Phase Bonding".

The method according to the invention is suitable for applying on a substrate functional layers or coatings, such as for example I-II/V semiconductors, germanium, polarisers, dielectrics and ferroelectrics or other parts or elements which can subsequently pass through further processes. Further-more, with the method, VCSEL cavities can be applied on silicon for a photonic integration, LEDs on a substrate for displays and illuminations and MEMS structures on silicon. Subsequent processes can serve for contacting, encapsulation or the like.

BRIEF DESCRIPTION OF THE DRAWINGS

The invention is explained subsequently with reference to FIGS. 1 to 4.

There are shown.

DETAILED DESCRIPTION OF THE INVENTION

Figure 1:
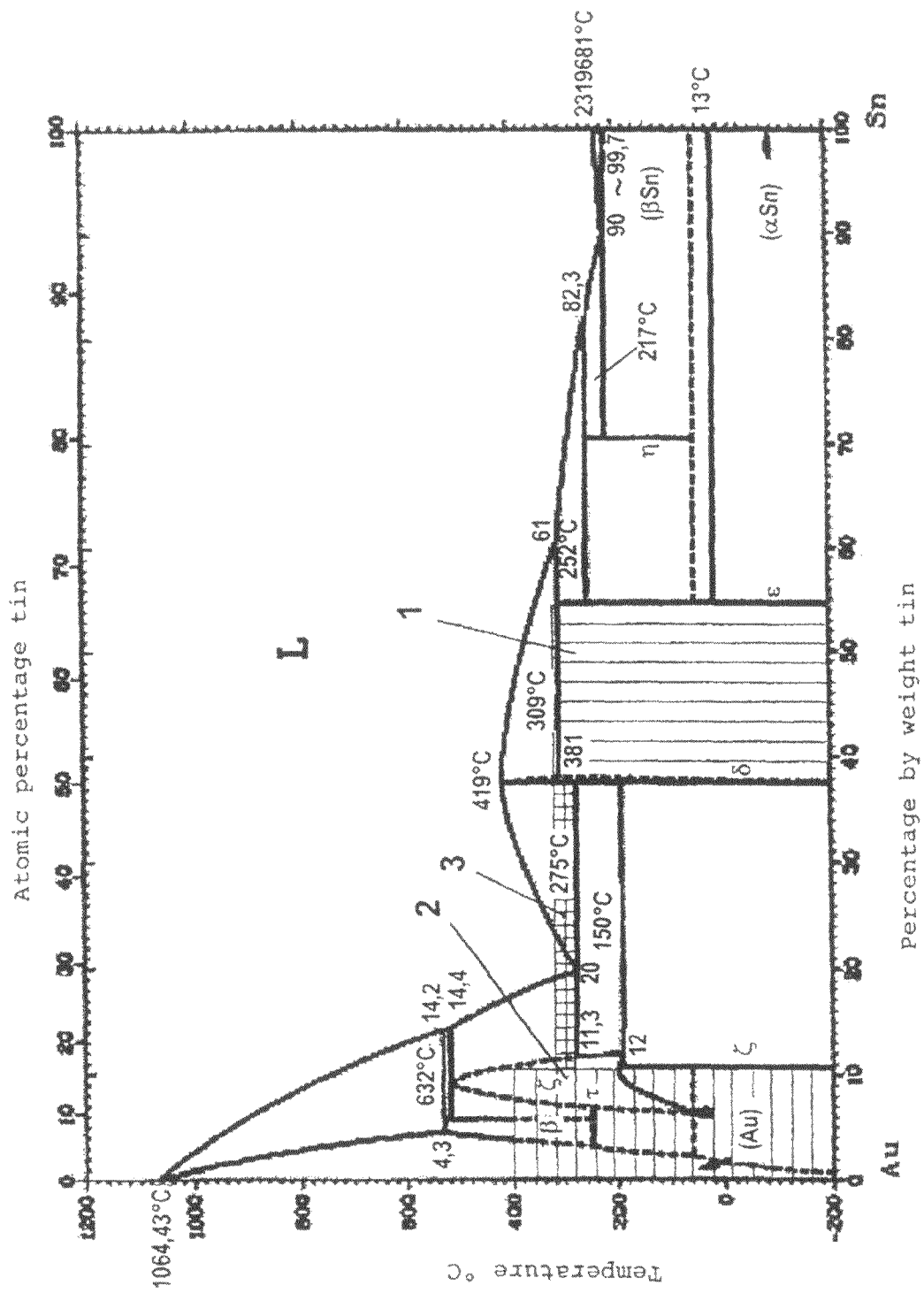
FIG. 1 an AuSn diagram.

FIG. 1 shows an AuSn diagram with three labelled regions. Within a first vertically hatched region 1, there are represented possible compositions for a first metal coating with an atomic Au proportion between 50 percent and 66 percent and a corresponding Sn proportion between 50 percent and 34 percent.

A second horizontally hatched region 2 shows possible compositions for a second metal coating with an atomic Au proportion between 100 percent and 84 percent and a corresponding Sn proportion between 0 percent and 16 percent.

A third, narrowly framed region 3 represents an upper and a lower delimitation by the temperatures 278° C. and 309° C. The lower delimitation, at 278° C., is the temperature of a eutectic reaction between the phases which form the region 1 and 2. The upper delimitation is the melting temperature of the phase with the lowest melting point from regions 1 and 2. A left delimitation represents a composition of the second metal coating with a highest permissible atomic Sn proportion of 16 percent and a right delimitation is provided by a composition of the first metal coating with a highest permissible atomic Au proportion of 50 percent.

If the first metal coating, which has a composition shown in region 2 in the solid state, and the second metal coating, which has a composition shown in region 1 in the likewise solid state, come in contact with each other, a liquid phase is formed with a composition of the elements Au and Sn shown in region 3. The equilibrium of this composition moves, because of a high Au proportion, further to the left until the element Sn is present bonded exclusively as $Au_5Sn$, as a result of which resolidification of the liquid phase occurs without a temperature drop.

Figure 2:
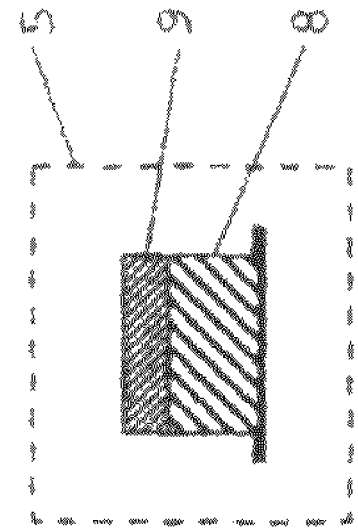
FIG. 2 a deposited and a pretreated first metal coating comprising Au and Sn.
Figure 2:
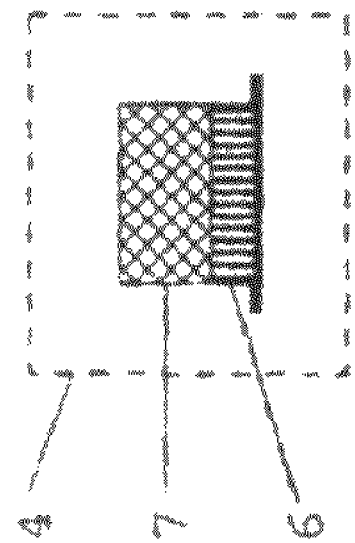

In FIG. 2, a deposited and a pretreated first metal coating (4; 5) comprising Au and Sn is represented. There are deposited on a substrate in succession firstly an Au layer 6 and then an Sn layer 7, the atomic ratio of Au to Sn being in a range of 50:50 to 33:67.

The deposited first metal coating 4 is thermally pretreated and, after diffusion and phase formation as a then pretreated first metal coating 5, has an AuSn layer 8 and an $AuSn_2$ layer 9 disposed thereabove.

Figure 3:
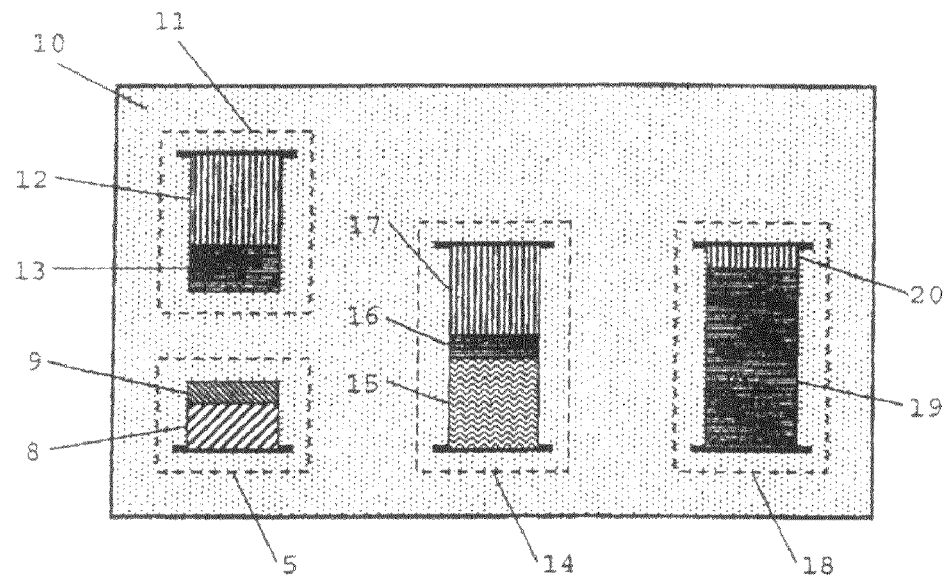
FIG. 3 a liquid medium in which a first metal coating comes into contact with a second metal coating.

FIG. 3 shows a liquid medium 10 in which a first pretreated metal coating 5 comes into contact with a second metal coating 11.

A first pretreated metal coating 5, which has the construction described already in FIG. 2, is situated together with a second metal coating 11, which has a deposited Au layer 12 and an $Au_5Sn$ layer 13 disposed thereabove, in the liquid medium 10 which can preferably be glycerine, ketones, sugar or a higher alcohol and is present in a defined temperature range between 278° C. and 309° C. in a liquid phase. The second metal coating 11 is formed by depositing an Au layer and an Sn layer, a layer sequence comprising gold and $Au_5Sn$ being formed in a thermal pretreatment by diffusion and phase formation. The second metal coating 11 can also be formed exclusively from gold.

As soon as the first pretreated metal coating 5 comes into contact with the second metal coating 11 in the liquid medium 10, a liquid solder 15 beginning at a contact point is produced and displacement of the composition is effected according to a process described in FIG. 1, a secure bond 14 being formed with the Au layer 17 dissolving-in by diffusion into the solidifying $Au_5Sn$ layer 16. This method is described also as "Transient Liquid Phase Bonding".

A completely solidified bond 18 has, in addition to a solidified $Au_5Sn$ layer 19, also a remaining Au layer 20.

Figure 4:
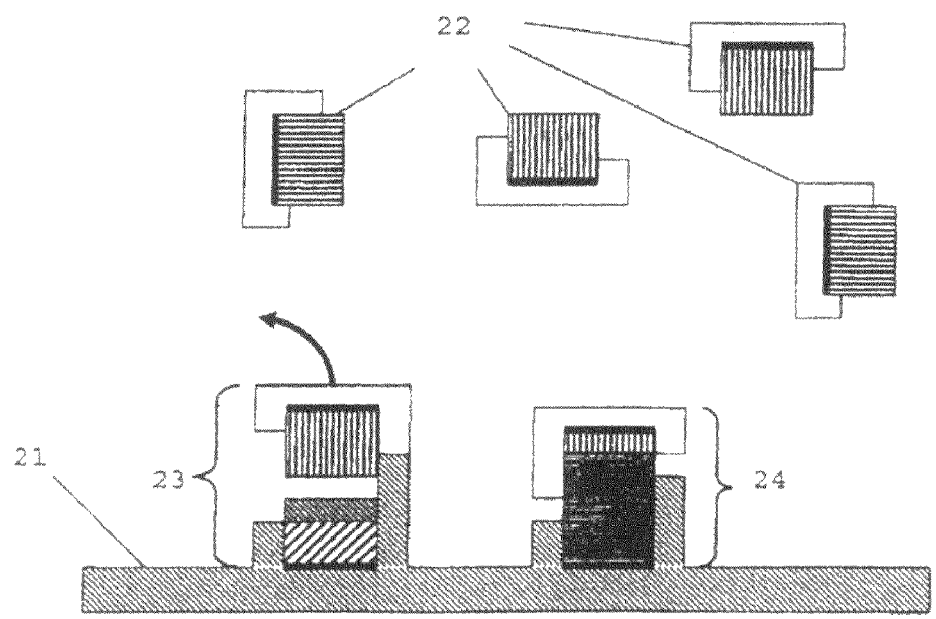
FIG. 4 a substrate and a plurality of components with metal coatings and complementary, geometric structures.

FIG. 4 shows a substrate 21 and a plurality of components 22 with metal coatings and complementary, geometric structures.

The substrate 21 is disposed in the liquid medium in which a plurality of components 22 are moving in a floating manner, movement being effected for example by agitation in order to achieve a large number of resulting contacts per unit of time.

There are situated on the substrate 21 a plurality of first metal coatings according to the invention which are disposed adjacently and around which geometric structures are disposed, and there are situated on the components 22 second metal coatings according to the invention, around which geometric structures which are complementary to the geometric structures on the substrate 21 are disposed.

The component can be thereby designed as a functional layer which is produced from a semiconducting, a ferroelectric, a dielectric, a polarising or a piezoelectric material.

If the component reaches a metal coating of the substrate 21 in an unsuitable orientation 23, the geometric structure prevents contact of the metal coatings and the component is separated again from the metallisation on the substrate by agitation movements taking place in the medium.

If the component is disposed in a suitable orientation 24 on a metal coating of the substrate 21, the metal coatings come into contact, melt and solidify to form a secure bond.

The described geometric structures can also be used for assembly of a component A on a component B, both components being introduced into the medium and being kept in motion. Contacts of similar pairs of components do not melt and separate again. Only formation of a complementary pairing effects a bond according to the invention.

REFERENCE NUMBER LIST

1 Region of the first material coating in the AuSn diagram
2 Region of the second material coating in the AuSn diagram
3 Region of the melting solder
4 Deposited layer arrangement
5 Pretreated layer arrangement
6 Deposited Au layer
7 Deposited Sn layer
8 $AuSn_2$ layer
9 AuSn layer
10 Liquid medium
11 Deposited and pretreated layer arrangement
12 Au layer
13 $Au_5Sn$ layer
14 Resulting bond 15 Liquid solder
16 Solidifying $Au_5Sn$ layer
17 Dissolving-in Au layer
18 Completely solidified bond
19 Solidified $Au_5Sn$ layer
20 Remaining Au layer
21 Substrate
22 Components with mechanical structures
23 Unsuitable orientation of a component with mechanical structures
24 Suitable orientation of a component with mechanical structures

What is claimed is:

1. A method for the production of a bond between a first element having at least one first metal coating and at least one further element having a second metal coating comprising:
    locating the first element and the at least one further element in a medium heated to a defined temperature range between 278° C. and 309° C., the at least one further element being freely movable in the medium, and the at least one first metal coating of the first element and the second metal coating of the at least one further element being in a solid state before contacting each other;
    forming a liquid phase upon contact of the at least one first metal coating and the second metal coating while in the heated medium; and
    solidifying the at least one first metal coating and the second metal coating to form a secure bond.

2. The method according to claim 1, wherein the first element is designed as a substrate.

3. The method according to claim 2, wherein the substrate is configured for the production of a bond with the at least one further element.

4. The method according to claim 1, wherein the at least one further element is a component to be bonded to the substrate.

5. The method according to claim 4, wherein the at least one component is designed as a functional layer.

6. The method according to claim 5, wherein the functional layer is produced from a semiconducting, a ferroelectric, a dielectric, a polarising or a piezoelectric material.

7. The method according to claim 1, wherein the liquid medium is formed from glycerine, ketones, sugar or higher alcohols.

8. The method according to claim 1, wherein a plurality of first metal coatings are disposed adjacently on the first element.

9. The method according to claim 1, wherein the first element and the at least one further element have a complementary, geometric shape.

10. The method according to claim 1, wherein the first element and/or the at least one further element have a mechanical limit stop.

11. The method according to claim 1, wherein the first metal coating is composed predominantly of gold and tin in a defined atomic ratio.

12. The method according to claim 11, wherein the defined atomic ratio of gold to tin for the first metal coating is in the range of 50:50 to 34:66.

13. The method according to claim 1, wherein the second metal coating is formed exclusively from gold.

14. The method according to claim 1, wherein the second metal coating is composed predominantly of gold and tin in a defined atomic ratio.

15. The method according to claim 1, wherein a defined atomic ratio of gold to tin for the second metal coating is in the range of 100:0 to 84:16.

* * * * *